(12) United States Patent
Talledo et al.

(10) Patent No.: US 9,536,756 B1
(45) Date of Patent: Jan. 3, 2017

(54) SEMICONDUCTOR PACKAGES SEPARATED USING A SACRIFICIAL MATERIAL

(71) Applicant: STMicroelectronics, Inc., Calamba (PH)

(72) Inventors: Jefferson Talledo, Calamba (PH); Amor Zapanta, Taguig (PH)

(73) Assignee: STMicroelectronics, Inc., Calamba (PH)

( * ) Notice: Subject to any disclaimer, the term of this patent is extended or adjusted under 35 U.S.C. 154(b) by 0 days.

(21) Appl. No.: 14/754,143

(22) Filed: Jun. 29, 2015

(51) Int. Cl.
```
H01L 21/00    (2006.01)
H01L 21/56    (2006.01)
H01L 21/48    (2006.01)
H01L 21/78    (2006.01)
```
(52) U.S. Cl.
CPC ......... *H01L 21/566* (2013.01); *H01L 21/4825* (2013.01); *H01L 21/4832* (2013.01); *H01L 21/561* (2013.01); *H01L 21/78* (2013.01)

(58) Field of Classification Search
CPC ................................................. H01L 23/49861
USPC ................................................. 438/112, 463
See application file for complete search history.

(56) References Cited

U.S. PATENT DOCUMENTS 8,551,820 B1 * 10/2013 Foster ..................... H01L 24/97
257/666

\* cited by examiner

*Primary Examiner* — Tuan Nguyen
(74) *Attorney, Agent, or Firm* — Seed IP Law Group LLP

(57) ABSTRACT

One or more embodiments are directed to semiconductor packages that are assembled using a sacrificial material, that when removed, separates the assembled packages into individual packages. The sacrificial material may be removed by a blanket technique such that a mask, pattern, or alignment step is not needed. In one embodiment the sacrificial material is formed on the lead frame on a connecting bar of a lead frame between adjacent leads. After the molding step, the connecting bar is etched away exposing a surface of the sacrificial material. The sacrificial material is removed, thereby separating the assembled packages into individual packages.

22 Claims, 3 Drawing Sheets

SEMICONDUCTOR PACKAGES SEPARATED USING A SACRIFICIAL MATERIAL

BACKGROUND

Technical Field

Embodiments of the present disclosure are directed to semiconductor packages and methods of forming same.

Description of the Related Art

A lead frame semiconductor package is often assembled and molded as a group of semiconductor packages in a lead frame strip. As is well known in the art, the lead frame strip includes a plurality of die pads and leads that are connected together by connecting bars. The die pads of the lead frame strip may be arranged in a single line or matrix.

After assembling the packages, the individual packages are separated from each other by a singulation process. The singulation process also removes the connecting bars, thereby electrically isolating the leads and the die pads with each assembled package. The singulation process, which typically involves sawing, laser cutting, or punching can cause problems. For instance, stresses may be induced into the packages during one or more of these singulation processes. The induced stresses may cause cracks in the molding material of the packages and can cause leads to detach from the molding material, thereby affecting the reliability of the package.

Additionally, saw blades, particularly worn saw blades, may cause leads to smear along the molding material. Adjacent leads that smear together can result in an unwanted electrical coupling of adjacent leads.

Another problem encountered during the singulation process is due to warpage of the molded lead frame strip. That is, the lead frame strip may have warpage induced during the molding process. The warpage may make it difficult for the lead strip to maintain a vacuum on a holding device for the singulation process.

Finally, sawing, laser cutting, and punching, in general, utilize patterned processing steps for separating the packages. For instance, the each of these processes utilize a grid pattern for aligning the lead frame strip, such as dicing streets, with a laser, saw blade, or punching mechanism. In that regard, mapping software or visual tooling is typically required in an automated singulation tool. This can make the singulation process expensive and time consuming.

BRIEF SUMMARY

One or more embodiments are directed to semiconductor packages that are assembled using a sacrificial material, that when removed, separates the assembled packages into individual packages. The sacrificial material can removed by a blanket technique that does not need a mask, pattern, or alignment step. In one embodiment the sacrificial material is formed on a connecting bar of a lead frame between adjacent leads. After the molding step, the connecting bar is etched away exposing a surface of the sacrificial material. The sacrificial material is removed in a maskless technique, thereby separating the assembled packages into individual packages.

In one embodiment, the sacrificial material is a polymer, such as a thermally decomposable polymer that is removed by a heat treatment step. In another embodiment, the sacrificial material is a fluid soluble material, such as a water-soluble synthetic polymer. Thus, the sacrificial material can removed in a water bath. In yet another embodiment, the sacrificial material is a photosensitive material that is removed in a fluid bath chemistry, such as a developer, that removes the photosensitive material.

BRIEF DESCRIPTION OF THE SEVERAL VIEWS OF THE DRAWINGS

In the drawings, identical reference numbers identify similar elements. Sizes and relative positions of elements in the drawings are not necessarily drawn to scale.

DETAILED DESCRIPTION

In the following description, certain specific details are set forth in order to provide a thorough understanding of various aspects of the disclosure. However, the invention described within the disclosure may be practiced without these specific details. In some instances, well-known structures and methods of forming the structures associated with semiconductor die have not been described in detail to avoid obscuring the descriptions of the embodiments and aspects of the present disclosure.

Figure 1:
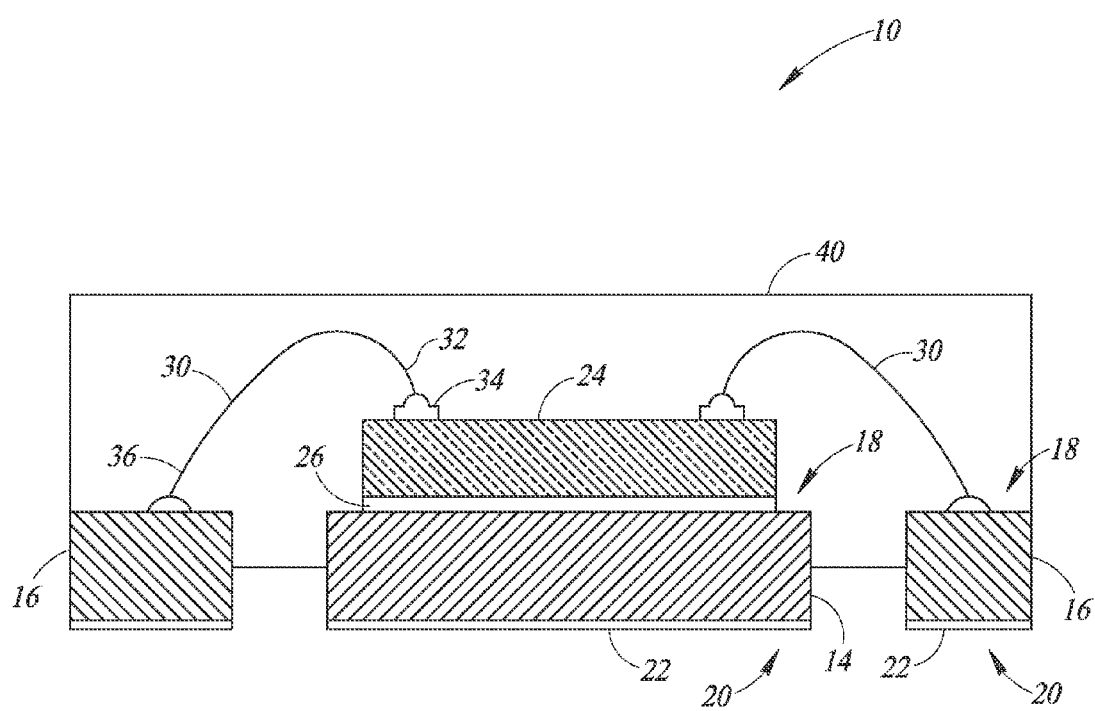
FIG. 1 is a cross-sectional view of a semiconductor package made in accordance with one embodiment of the present disclosure.

FIG. 1 shows a semiconductor package 10 in accordance with one embodiment of the disclosure. The package 10 includes a lead frame including a die pad 14 and a plurality of leads 16. The lead frame has upper and lower surfaces 18, 20. Although only two leads 16 are shown, one on each side of the die pad, it is to be appreciated that any number of leads may be located proximate any number of sides of the die pad, including only one lead located proximate one side of the die pad.

The lead frame includes one or more conductive materials, and may be formed of a metal material, such as copper or a copper alloy. The lower surfaces 20 of the die pad 14 and the leads 16 of the lead frame are plated with one or more conductive layers 22. The one or more conductive layers 22 may be nanolayers or microlayers of metal materials, such as Ag, Ni/Pd, Ni/Pd/Ag, Ni/Pd/Au—Ag alloy, or Ni/Pd/Au/Ag. The one or more conductive layers 22 protect the lead frame, such as from corrosion and oxidation, and thereby provide improved electrical coupling with other components. Additionally, the conductive layers 22 provide a wettable surface of conductive bumps, such as solder, to flow along when the package is coupled to another device or board. As will be explained below, the one or more conductive layers 22 act as an etch mask during assembly and singulation of the assembled packages of the lead frame strip into individual packages.

Although not shown, one or more layers of conductive layers may also be deposited on the upper surface of the leads 16 and/or the die pads 14 of the leadframe strip.

A semiconductor die 24 is secured to the upper surface 18 of the die pad 14 by an adhesive material 26. The semiconductor die 24 includes an electrical device, such as a sensor, one or more integrated circuits, or any other electrical components as is well known in the art. The adhesive material 26 may be any material configured to secure the die 24 to the die pad 14, such as glue, paste, tape, or the like. In one embodiment, the adhesive material 26 is an epoxy glue and may include resin and a filler material.

Conductive wires 30 electrically couple the die 24 to the leads 16. That is, a first end 32 of the conductive wire 30 is coupled to a bond pad 34 of the die 24, and a second end 36 of the conductive wire 30 is coupled to the upper surface 18 of the lead 16. The bond pad 34 of the die 24 is electrically coupled to the electrical device or structures formed in the die. Thus, the electrical device of the die 24 is electrically coupled to the leads 16 by the conductive wires 30.

Encapsulation material 40 surrounds the die 24 and the conductive wires 30 and is located over at least the upper surface of the leads 16 and the die pad 14. The encapsulation material 40 is an insulative material that protects the electrical components and materials within the package, such as the conductive wires 30 and the dice 24. In particular, the encapsulation material 40 may protect the electrical components and materials from corrosion, physical damage, moisture damage, or other causes of damage to electrical devices and materials. In one embodiment, the encapsulation material 40 is a molding compound, such as a polymer resin.

The package 10 is configured to be coupled to an external device, such as another package or board, as will be understood by persons of ordinary skill in the art. The leads 16 provide electrical connection for the die 24 outside of the package 10. In particular, connection bumps (not shown), such as solder balls, couple the leads 16 of the package 10 to the external device.

Figure 2A:
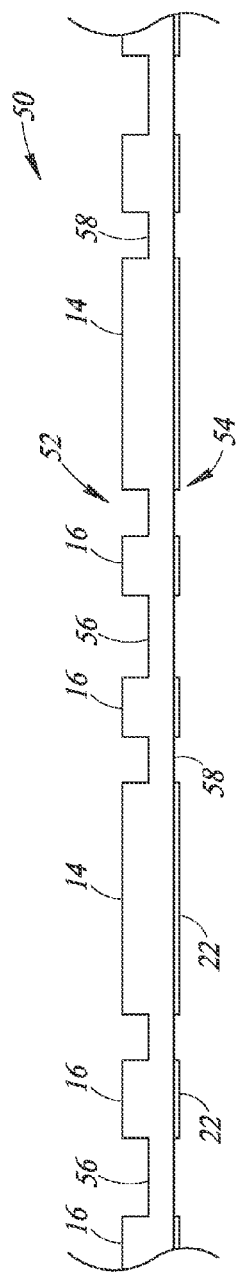
FIGS. 2A-2F illustrate cross-sectional views of various stages of assembling the semiconductor package of FIG. 1.

FIGS. 2A-2F illustrate processing steps for forming a plurality of semiconductor packages, such as the semiconductor package 10 of FIG. 1, in accordance with one embodiment of the disclosure. As shown in FIG. 2A, the process begins with a lead frame strip 50 having an upper surface 52 and a lower surface 54. The lead frame strip 50 is etched to form a plurality of die pads 14 and a plurality of leads 16. Portions of the leads 16 and the die pads 14 remain coupled together by lead connecting bars 56 and die pad connecting bars 58.

The leads 16 are located at a peripheral portion of a corresponding die pad 14. In that regard, between adjacent die pads 14 are a plurality of leads 16. Although only two leads are shown between adjacent die pads 14, it will be recognized by persons of ordinary skill in the art, the many leads may be etched between two adjacent die pads 14.

In the illustrated embodiment, a pair of adjacent leads 16 is located between adjacent die pads 14. One of leads 16 of the pair is associated with one of the die pads 14 and the other of the leads 16 of the pair is associated with the other of the die pads 14. The two adjacent leads 16 of the pair are coupled together by the lead connecting bars 56. The lead connecting bars 56 are coupled together along an entire width (in and out of the page) of the leads 16. Furthermore, the lead connecting bar 56 continues to extend to the adjacent leads 16 located along the same side of the die pads 14 and is coupled to each of the leads on the same side of the die pad 14. That is, the lead connecting bar 56 extends into and out of the page along a side of the die pad 14.

The die pads 14 are coupled to the adjacent leads 16 by the die pad connecting bars 58. The die pad connecting bars 58 extend from a side of the die pad 14 to a side of a lead 16. The lead frame strip 50 is made from one or more conductive materials, and in one embodiment is made of copper. The lead frame strip may be formed to include the die pads 14, leads 16, lead connecting bars 56 and die pad connecting bars 58 using standard lead frame forming techniques including stamping.

Although only a few die pads 14 are shown, as will be clear to a person of ordinary skill in the art, the lead frame strip 50 may include any number of die pads. Additionally, each package being formed may include one or more die pads. Furthermore, the lead frame strip 50 may include the die pads in a single row or may include die pads in a matrix form.

As shown in FIG. 2A, one or more layers of conductive layers 22 are deposited on the lower surface of the leads 16 and the die pads 14 of the lead frame strip 50. In one embodiment, the conductive layers 22, such as Ni/Pd/Ag, Ni/Pd/Au—Ag alloy, or Ni/Pd/Au/Ag are plated on the lower surface, and optionally on the upper surface, of the leads 16 and the die pads 14. As will be explained below, the one or more conductive layers 22 may act as an etch mask when removing the lead connecting bars 56 and the die pad connecting bars 58 and when the assembled packages are separated from each other.

Figure 2B:
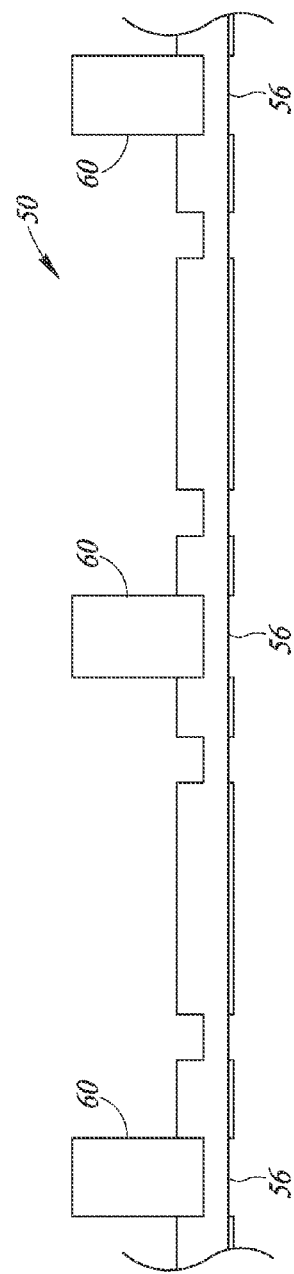

As shown in FIG. 2B, a sacrificial material 60 is formed over the lead connecting bars 56 of the lead frame strip 50. In one embodiment, the sacrificial material 60 is a polymer, such as a thermally decomposable polymer, such as polycarbonate or a water-soluble synthetic polymer, such as polyvinyl alcohol (PVA), or any other fluid soluble material. In another embodiment, the sacrificial material is a photosensitive material, such as photoresists, that may be easily removed in a chemistry bath, such as a developer.

In one embodiment, the sacrificial material 60 is formed on the lead connecting bars 56 of the lead frame strip 50 using standard molding techniques, such as by placing the lead frame strip 50 in a mold and injecting the sacrificial material 60 into the mold. The sacrificial material 60 will travel in the mold along the lead connecting bars 56. The sacrificial material 60 may harden over time and in some cases may require a curing step to harden. In other embodiments, the sacrificial material is pattern deposited onto the lead connecting bars 56. In yet another embodiment, the sacrificial material 60 is blanket deposited over the entire lead frame strip 50 and then removed at all locations excluding those over the lead connecting bars 56. For instance, if the sacrificial material 60 is a photosensitive material, the photosensitive material may be a positive or negative photoresist. In one embodiment, the photosensitive material may be blanket deposited, go through a patterned light exposure, and then exposed or unexposed portions of the photosensitive material are removed so that only photosensitive material over the connecting bars 56 remains, thereby forming the sacrificial material 60.

Figure 2C:
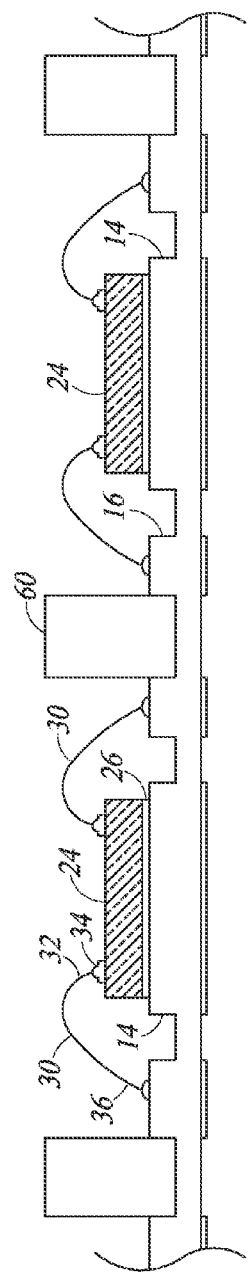

As shown in FIG. 2C, a plurality of semiconductor dice 24 are secured to the upper surfaces of the die pads 14 by an adhesive material 26. The adhesive material 26 may be applied to at least one of a bottom surface of the die 24 and an upper surface of the die pad 14 using standard assembly techniques. The semiconductor die 24 is electrically coupled to the leads 16 by conductive wires 30. That is, a first end 32 of the conductive wire 30 is coupled to a bond pad 34 of the die 24 and a second end 36 of the conductive wire 30 is coupled to the lead 16 using standard assembly techniques.

Although not shown, the die may be electrically coupled to the lead in a flip chip arrangement as is well known in the art. That is, the dice would be larger than shown in the Figures so that the outer perimeter of each die would be located on a portion of the upper surface of the leads. Solder balls located between the die and the lead would provide electrical communication therebetween. In that regard, the leads may provide electrical and mechanical support for the die. Thus, in some embodiments, the lead frame strip may not include die pad.

Figure 2D:
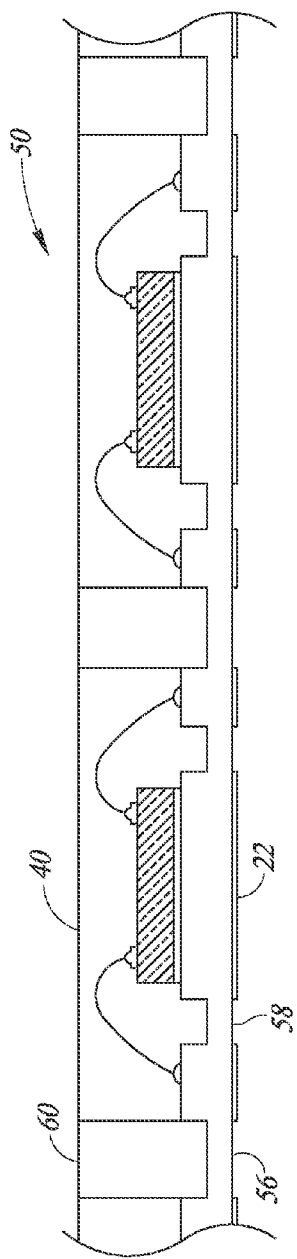

As shown in FIG. 2D, encapsulation material 40 is formed over the lead frame strip 50, using conventional packaging techniques thereby forming a plurality of assembled packages. For example, a molding process may be used to form the encapsulation material 40 over the lead frame strip 50, as is well known in the art. That is, the lead frame strip 50 is placed in a mold and the encapsulation material 40 is introduced into the mold. The encapsulation material 40 flows through the mold and hardens over time. In some embodiments, the encapsulation material 40 may harden with one or more curing steps, however, this will depend on the encapsulation material being used. The curing steps may occur during any subsequent process step following the encapsulation step.

Figure 2E:
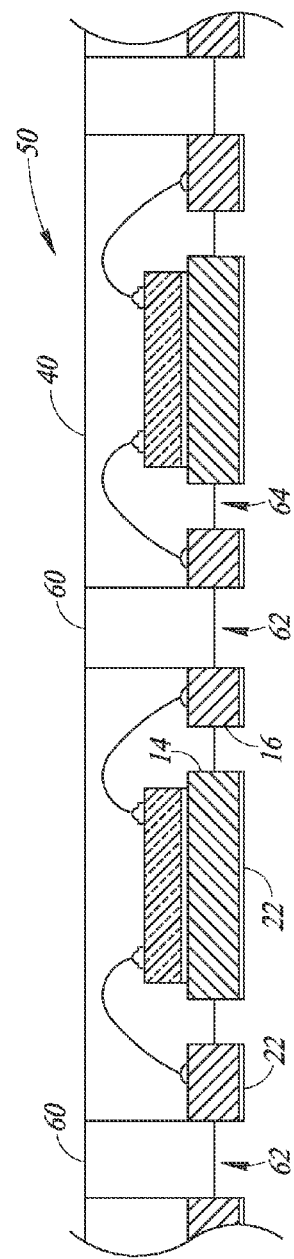

As shown in FIG. 2E, the lead connecting bars 56 and the die pad connecting bars 58 are removed. As shown in FIG. 2E, the removal of the lead connecting bars 56 and the die connecting bars 58 exposes lower surfaces 62 of the sacrificial material 60 and lower surfaces 64 the encapsulation material 40, respectively.

The lead and die pad connecting bars 56, 58 may be removed using standard lead frame etching techniques. In one embodiment, the etch chemistry is an ammonia base chemistries. The one or more conductive layers 22 on the lower surface of the leads 16 and the die pads 14 are substantially resistant to the etch chemistries and thereby act as an etch mask. Similarly, the encapsulation material 40 is substantially resistant to the etch chemistries as well. In that regard, the encapsulation material forms an etch stop. The sacrificial material 60 may also be substantially resistant to the etch chemistries as well.

When etching of the lead and die pad connecting bars 56, 58 is complete, electrical components are isolated, while at the same time the assembled packages remain mechanically coupled together. In particular, by removing the lead connecting bars 56 each assembled package is electrically isolated from the other assembled packages, while at the same time maintaining a mechanical coupling with each other by the sacrificial material 60. Similarly, by removing the die pad connecting bars 58, the die pad 14 of each assembled package is electrically isolated from the leads 16 of the same assembled package, while at the same time remaining mechanically coupled together by the encapsulation material 40.

While each assembled package is electrically isolated from the other assembled packages, each package may be electrically tested while still mechanically coupled together in lead frame strip form. That is, while the assembled packages remain mechanically coupled to each other by the sacrificial material 40 handling of the packages is easier during electrical testing. The ability to electrically test the packages in strip form provides significant benefits as will be clear to a person of ordinary skill in the art. A strip that includes a plurality of packages coupled together is easier to handle than each package individually. In that regard, electrical testing of the individual packages can be completed in a simplified manner, and more efficiently than electrical testing of individual packages.

Figure 2F:
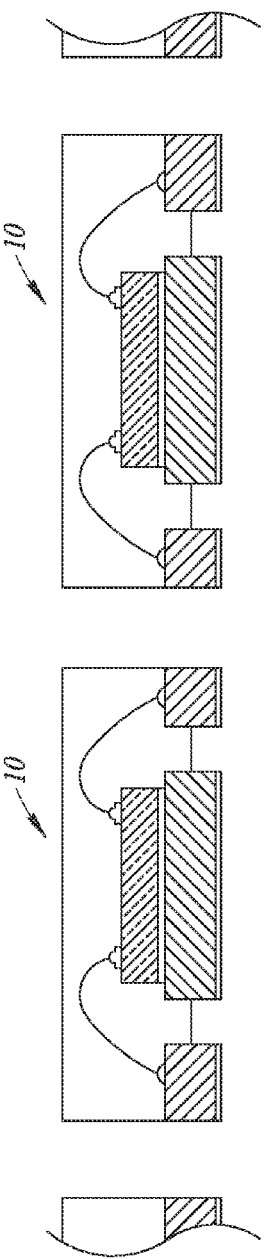

As shown in FIG. 2F, the sacrificial material 60 is removed thereby separating the assembled packages into individual packages 10. The sacrificial material 60 may be removed using various techniques and the method used depends on the type of material used for the sacrificial material 60. In one or more embodiments, the sacrificial material 60 is removed using a blanket technique in which most, if not all, of the assembled lead frame strip is exposed to the removal step without an alignment or mask type feature.

In the embodiment in which the sacrificial material 60 is a thermally decomposable polymer, the sacrificial material may be removed by exposing the lead frame strip to a heat treatment process, such as by placing the lead frame strip in an oven. As will be clear to persons of ordinary skill in the art, the processing time and temperatures used for the heat treatment process will be those that are suitable to decompose the polymer and will depend on the particular type of polymer used. The polymer will decompose and/or dissolve when exposed to heat thereby separating the packages from each other.

In the embodiment in which the sacrificial material 60 is soluble in a fluid, such as a water soluble material like polyvinylalcohol (PVA), the sacrificial material 60 is removed by placing the lead frame strip in a fluid bath, such as a water bath. In some embodiments, the bath may include agitation.

In the embodiment, in which the sacrificial material 60 is a photosensitive material, the photosensitive material may be removed using various standard methods for removing photosensitive material. The method will depend on the particular type of photosensitive material used. In one embodiment, the photosensitive material is removed by a developer. In one embodiment, chemistries used to remove the photosensitive material may be completed in a bath and may include agitation. In another embodiment, the photosensitive material is removed by exposure to a heat treatment process, such as in an oven.

Various benefits to separating the individual packages using a sacrificial material may be obtained. In particular, it will be appreciated that the singulation step does not adversely affect components in the package. For instance, the packages may be separated without inducing mechanical stresses into the package that often occur during a sawing process or punching process. Additionally, by not sawing the assembled packages formed on the lead frame strips, saw burrs extending from the leads can be eliminated.

A person of ordinary skill in the art will appreciate that in one or more embodiments, the packages are singulated by removing the sacrificial material in a patternless or maskless manner. Rather, the entire lead frame strip may be exposed to the removal method. In that regard, the singulation step can be completed without a time consuming alignment step for aligning with dicing streets of the assembled packages on the lead frame strip, such as those associated with automated cutting tools. Significantly, the separation process does not require expensive sawing equipment.

Further, the equipment used to remove the sacrificial layer can be low cost, standard equipment that is widely available and requires no special alignment equipment. There is no need to do an alignment step, a pattern and etch step or other time-consuming multiple step process. In the heat removal embodiment, the lead frame strip is simply heated in an oven to a standard operating temperature, such as 200° C. to 260° C., or something in or around that range. The chip and package will be expected to be exposed to, and may generate themselves, temperatures in the range of 260° C. often in its operating life and not degrade in performance. Thus, heating them to 260° C. does not harm them, yet will fully melt away the sacrificial layer 60.

Similarly, if the material 60 is water soluble, the entire lead frame is simply washed in water for a period of time to fully remove layer 60 but not impact, harm, or remove any part of the package or lead frame.

It is to be appreciated that the method shown and described in FIGS. 2A-2F may be performed in a different order than shown. For instance, the die may be secured to the die pad and electrically coupled to the leads prior to forming the sacrificial material over the lead connecting bars.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method comprising:
coupling a first die to a first die pad;
coupling a second die to a second die pad;
coupling a first end of a first conductive wire to a pad of the first die and coupling a second end of the first conductive wire to a first lead;
coupling a first end of a second conductive wire to a pad of the second die and coupling a second end of the second conductive wire to a second lead, the first and second leads being connected to each other by a lead connecting bar;
forming a sacrificial layer on an upper surface of the lead connecting bar;
encapsulating the first and second dice, the first and second conductive wires, and portions of the first and second leads and the connecting bar with encapsulation material;
etching the lead connecting bar to expose a surface of the sacrificial layer; and
removing the sacrificial layer using a blanket technique without a mask to form first and second semiconductor packages.

2. The method of claim 1 further comprising plating the bottom surfaces of the first and second leads and the first and second die pads with one or more conductive layers and leaving the bottom surface of the lead connecting bar un-plated, wherein the one or more conductive layers act as an etch mask when the lead connecting bar is etched to expose the surface of the sacrificial layer.

3. The method of claim 1 further comprising etching a die pad connecting bar coupling the first die pad to the first lead, wherein etching the die pad connecting bar exposes a surface of the encapsulation material.

4. The method of claim 3, wherein etching the die pad connecting bar and etching the lead connecting bar occur in the same etch step.

5. The method of claim 1, wherein the sacrificial layer is one of a thermally decomposable polymer, a water soluble material, and a photosensitive material.

6. The method of claim 1, wherein the sacrificial layer is a thermally decomposable polymer, and wherein removing the sacrificial layer comprises heat treating the thermally decomposable polymer.

7. The method of claim 1, wherein the sacrificial layer is a water soluble material.

8. The method of claim 1, wherein forming the sacrificial layer on the upper surface of the lead connecting bar comprises using a mold and injecting the sacrificial layer into the mold over the upper surface of the lead connecting bar.

9. A method comprising:
coupling a first die to a first die pad;
coupling a second die to a second die pad;
electrically coupling the first die to a first lead;
electrically coupling the second die to a second lead, the second lead being coupled to the first lead by a lead connecting bar;
depositing a sacrificial material on the lead connecting bar;
encapsulating the first die and the second die with encapsulation material, the encapsulation material abutting side surfaces of the sacrificial material;
removing the lead connecting bar to expose a lower surface of the sacrificial material; and
removing the sacrificial material to separate a first package that includes the first die from a second package that includes the second die.

10. The method of claim 9, wherein removing the sacrificial material comprises heat treating the sacrificial material.

11. The method of claim 10, wherein the sacrificial material is polycarbonate.

12. The method of claim 11, wherein polycarbonate decomposes or dissolves during the heat treatment step to separate the first package from the second package.

13. The method of claim 9, wherein removing the sacrificial material comprises removing the sacrificial material by placing the sacrificial material in a bath of fluid.

14. The method of claim 13, wherein the fluid is water.

15. The method of claim 9, wherein forming the sacrificial material over the lead connecting bar comprises using a molding process to form the sacrificial material over the lead connecting bar.

16. The method of claim 9, wherein forming the sacrificial material over the lead connecting bar occurs before the first die is coupled to the first die pad and before the second die is coupled to the second die pad.

17. A method comprising:
forming a sacrificial layer on a connecting bar that couples a first lead of a lead frame to a second lead of the lead frame;
assembling first and second packages on the lead frame, the first lead being part of the first package and the second lead being part of the second package;
removing the connecting bar to expose a surface of the sacrificial layer and to decouple the first lead from the second lead; and
removing the sacrificial layer to separate the first package from the second package.

18. The method of claim 17 wherein removing the connecting bar comprises etching the connecting bar to expose the surface of the sacrificial layer.

19. The method of claim 17 wherein the sacrificial layer is thermally decomposable polymer, wherein removing the sacrificial layer to separate the first package from the second package comprises heat treating the thermally decomposable polymer.

20. The method of claim 17, wherein removing the sacrificial layer to separate the first package from the second package comprises using a fluid bath to remove the sacrificial layer.

21. The method of claim 20, wherein the sacrificial layer dissolves in the fluid bath.

22. The method of claim 17, wherein the sacrificial layer is polyvinyl alcohol.

* * * * *